(12) United States Patent
Tseng

(10) Patent No.: US 6,358,797 B1
(45) Date of Patent: Mar. 19, 2002

(54) METHOD OF FORMING A NON-VOLATILE MEMORY CELL

(75) Inventor: Horng-Huei Tseng, Hsinchu (TW)

(73) Assignee: Vanguard International Semiconductor Corporation, Hsinchu (TW)

(*) Notice: Subject to any disclaimer, the term of this patent is extended or adjusted under 35 U.S.C. 154(b) by 0 days.

(21) Appl. No.: 09/782,266

(22) Filed: Feb. 12, 2001

(51) Int. Cl.⁷ .............................................. H01L 21/336
(52) U.S. Cl. ........................ 438/257; 438/263; 438/266
(58) Field of Search ................................. 438/257, 258, 438/259, 260, 261, 263, 264, 265, 266, 267

(56) References Cited

U.S. PATENT DOCUMENTS

| | | | | |
|---|---|---|---|---|
| 5,029,130 A | * | 7/1991 | Yeh | 365/185 |
| 6,165,845 A | * | 12/2000 | Hsieh et al. | 438/260 |
| 6,194,300 B1 | * | 2/2001 | Hung et al. | 438/593 |
| 6,251,727 B1 | * | 6/2001 | Chen | 438/257 |
| 6,284,596 B1 | * | 9/2001 | Sung et al. | 438/257 |
| 6,294,429 B1 | * | 9/2001 | Lam et al. | 438/260 |

* cited by examiner

Primary Examiner—Charles Bowers
Assistant Examiner—Jack Chen
(74) Attorney, Agent, or Firm—Blakely Sokoloff Taylor & Zafman, LLP

(57) ABSTRACT

A method of forming a non-volatile memory cell having a floating gate with sharp corners is disclosed. First, a first dielectric layer and a first silicon layer are formed on a semiconductor substrate. An etching stop layer is next formed on the first silicon layer. After patterning the etching stop layer to form an opening, a dish-shaped hole is formed by performing an isotropic etching process to partially etch the first silicon layer through the opening. After removing the etching stop layer, a second dielectric layer is formed to refill the dish-shaped hole. After that, a dielectric stud is formed by performing a planarization process to remove a portion of the second dielectric layer outside the dish-shaped hole. Thereafter, a floating gate with sharp corners is formed by performing an anisotropical etching process to etch an exposed portion of the first silicon layer using the dielectric stud as an etching mask. Finally, the dielectric stud is removed.

20 Claims, 4 Drawing Sheets

METHOD OF FORMING A NON-VOLATILE MEMORY CELL

BACKGROUND OF THE INVENTION

(1) Field of the Invention

The present invention relates generally to a method of manufacturing a non-volatile memory cell, and more particularly, to a method of forming a non-volatile memory cell having a floating gate with sharp corners.

(2) Description of the Related Art

Integrated circuits (ICs), such as ultra-large scale integrated (ULSI) circuits, can include as many as one billion transistors or more. The ULSI circuits are generally composed of complementary metal oxide semiconductor field effect transistors (MOSFETs). For a typical random access memory (RAM), the data stored in the memory is volatile. For this reason, a power supply is needed to refresh the data stored in the memory.

On the other hand, non-volatile memories such as Read-only-memories (ROMs), electrically erasable programmable ROM (EEPEOM) or flash memories, are memories into which information is permanently stored.

In order to reduce the production cost and enhance the manufacture yield of a non-volatile memory device, it is important to develop a single-transistor electrically programmable and erasable memory device. For this reason, a method for forming a single transistor non-volatile electrically alterable semiconductor memory device was disclosed in U.S. Pat. No. 5,029,130. According to this prior art, referring first to FIG. 1A, a first insulating layer 12 is formed on a silicon substrate 10. Thereafter, a polysilicon layer 14 and a silicon nitride layer 16 are formed on the first insulating layer 12. After that, the silicon nitride layer 16 is next patterned by performing conventional photolithographic and etching process to form an opening 18.

Referring now to FIG. 1B, a thermal oxidation process is performed to form an oxide layer 20 in the opening 18. As shown in FIG. 1B, the silicon nitride layer 16 is partially lifted during the thermal oxidation process because of the bird's beak effect. Next, the silicon nitride layer 16 is removed by performing a wet etching process, as shown in FIG. 1C.

Referring now to FIG. 1D, an anisotropic etching process is applied to selectively etch the exposed polysilicon layer 14 which is not directly beneath the oxide layer 20. A floating gate 22 with sharp curved-up portion is thus formed, as shown in FIG. 1D.

Referring now to FIG. 1E, a thermal oxide layer 24 is grown to a certain thickness over the floating gate 22. Thereafter, nitridization of the oxide layer 24 is performed by thermally annealing the oxide layer 24 with dilute $NH_3$ using $N_2$ or Ar as a carrier gas at an elevated temperature; e.g., greater than 800° C. This will result in the formation of an oxynitride film. Finally, a second polysilicon layer 26 is deposited over the oxynitride layer 24. The second polysilicon layer 26 is going to be patterned to form the control gate of the non-volatile memory cell.

According to this prior art, with a sharply defined charge injection edge, the tunneling probability of electrons between the floating gate and the control gate is at the highest. This results in a floating gate having a well-defined charge injection edge to cause tunneling of charges from the floating gate to control gate.

SUMMARY OF THE INVENTION

Accordingly, it is a primary object of the present invention to a method of forming a non-volatile memory cell having a floating gate with sharp corners.

It is another object of the present invention to provide a non-volatile memory cell with a floating gate having sharp corners.

It is further another object of the present invention to provide a method of forming a gate structure with sharp corners.

A method of forming a non-volatile memory cell having a floating gate with sharp corners is disclosed. First, a first dielectric layer and a first silicon layer are formed on a semiconductor substrate. An etching stop layer is next formed on the first silicon layer. After patterning the etching stop layer to form an opening, a dish-shaped hole is formed by performing an isotropic etching process to partially etch the first silicon layer through the opening. In one embodiment of the present invention, the isotropic etching process is performed by a wet etching process using a mixture solution of nitric acid and hydrofluoric acid as etchant. In another embodiment of the present invention, the isotropic etching process is performed by a dry etching process using $Cl_2$ as etchant.

After removing the etching stop layer, a second dielectric layer is formed to refill the dish-shaped hole. After that, a dielectric stud is formed by performing a planarization process such as CMP to remove a portion of the second dielectric layer outside the dish-shaped hole. Thereafter, a floating gate with sharp corners is formed by performing an anisotropical etching process to etch an exposed portion of the first silicon layer using the dielectric stud as an etching mask. After removing the dielectric stud by performing a wet etching process, a tunneling dielectric layer is formed over the floating gate. Finally, a control gate of the non-volatile memory cell is formed on the tunneling dielectric layer and the first dielectric layer.

BRIEF DESCRIPTION OF THE DRAWINGS

The accompanying drawings forming a material part of this description, in which.

DESCRIPTION OF THE PREFERRED EMBODIMENTS

The present invention relates generally to a method of manufacturing a non-volatile memory cell, and more particularly, to a method of forming a non-volatile memory cell having a floating gate with sharp corners.

Figure 1A:
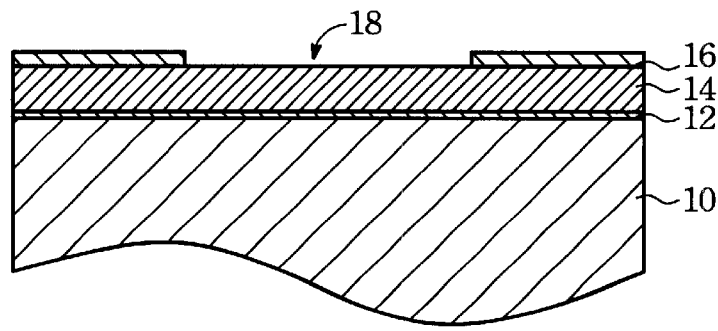
FIG. 1A to FIG. 1E schematically illustrate the cross-sectional diagram of the method of forming a single transistor non-volatile electrically alterable semiconductor memory device according to the prior art.
Figure 1B:
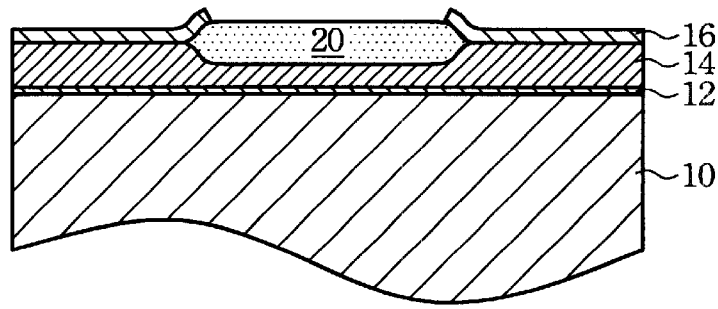
Figure 1C:
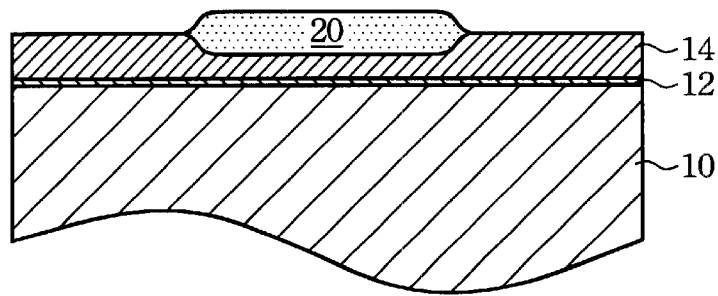
Figure 1D:
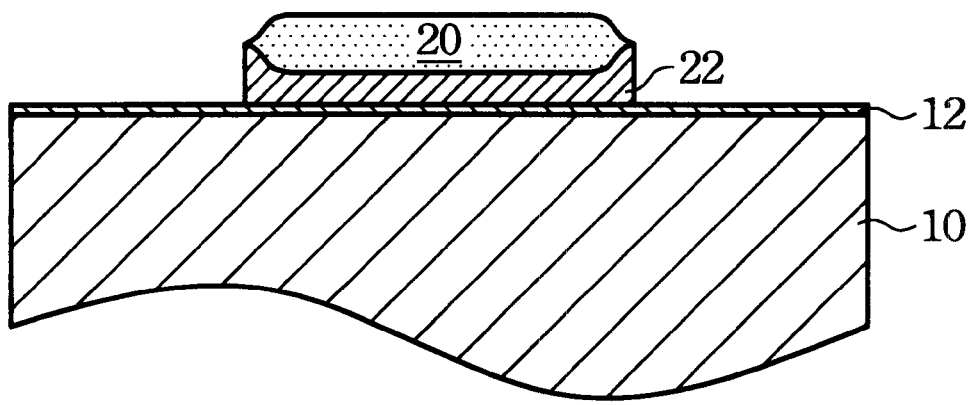
Figure 1E:
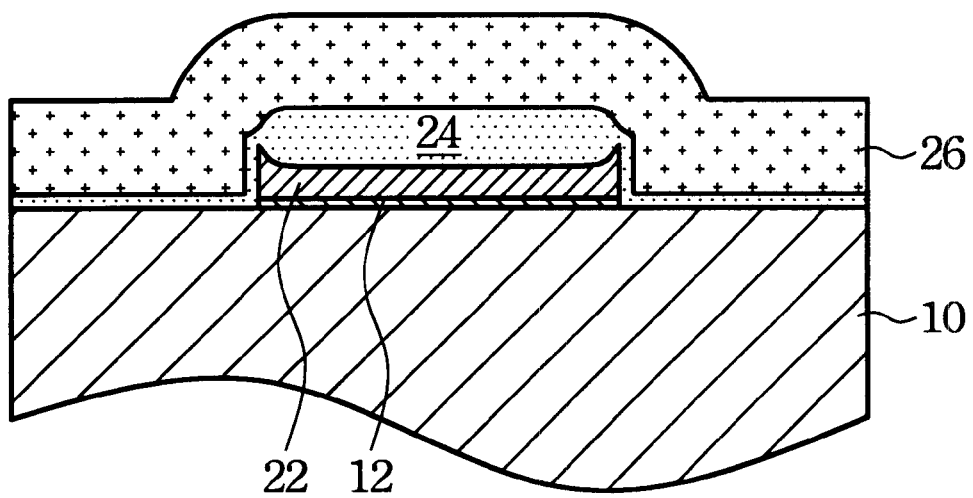
Figure 2A:
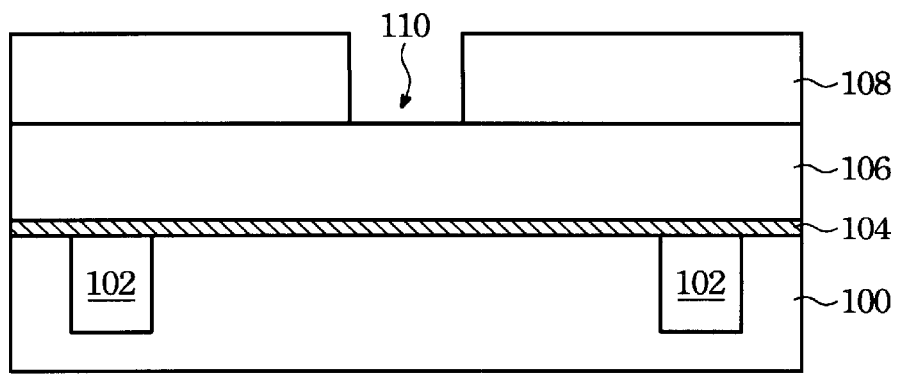
FIG. 2A to FIG. 2E schematically illustrate the cross-sectional diagram of the method of forming a non-volatile memory cell according to the present invention.

Referring first to FIG. 2A, a semiconductor substrate 100 comprised of P-type single crystalline silicon is provided. Shallow trench isolation regions (STI) 102 are next formed in the semiconductor substrate 100, and the active region is also defined. After that, a first dielectric layer 104, a first silicon layer 106, and an etching stop layer 108 are formed on the semiconductor substrate 100 in sequence. Thereafter, an opening 110 for defining a floating gate of the non-volatile memory cell is formed by patterning the etching stop layer 108. During the patterning procedure, the conventional photolithographic process and anisotropic process are applied.

The shallow trench isolation regions 102 are formed by first forming shallow trenches in the semiconductor substrate 100 using the conventional photolithographic and anisotropic reactive ion etching (RIE) procedures. After removal of the photoresist shape used to define the shallow trenches, a silicon oxide layer is deposited by low-pressure chemical vapor deposition (LPCVD) or plasma enhanced chemical vapor deposition (PECVD) procedures for completely filling the shallow trenches. A chemical mechanical polishing (CMP) process is then performed to remove silicon oxide from the top surface of the semiconductor substrate 100. The first dielectric layer 104 is formed by conventional deposition process such as thermal oxidation, PECVD or LPCVD to a thickness between 70 Angstroms to 200 Angstroms. The first dielectric layer 104, which serves as a gate dielectric layer, is composed of silicon dioxide ($SiO_2$), silicon nitride, or silicon oxynitride. The first silicon layer 106, composed of polysilicon or amorphous silicon, is deposited by a low-pressure CVD (LPCVD) process or a plasma-enhanced CVD (PECVD) process to a thickness between 500 Angstroms to 3000 Angstroms.

In one embodiment of the present invention, the etching stop layer 108 is composed of dielectric material, such as silicon oxide, silicon nitride or silicon oxynitride. The opening 110 is formed by using traditional photolithography process and anisotropic etching process to pattern the etching stop layer 108. In another embodiment of the present invention, the etching stop layer 108 is a layer of photo resist. The opening 110 is formed by performing traditional photolithography process.

Figure 2B:
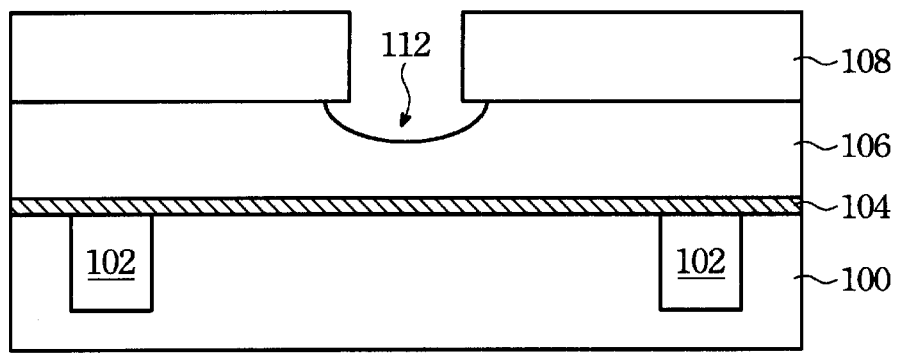

As shown in FIG. 2B, the first silicon layer 106 is partially etched by performing an isotropic etching process through the opening 110 to form a dish-shaped hole 112. In one embodiment of the present invention, the isotropic etching process is performed by a wet etching process using a mixture solution of nitric acid and hydrofluoric acid as etchant. In another embodiment of the present invention, the isotropic etching process is performed by a dry etching process using $Cl_2$ plasma as etchant.

After that, the etching stop layer 108 is removed. In one embodiment of the present invention, the etching stop layer 108 composed of dielectric material is removed by performing a wet etching process. In another embodiment of the present invention, the etching stop layer 108 composed of photo resist is removed by performing an oxygen ashing process.

Figure 2C:
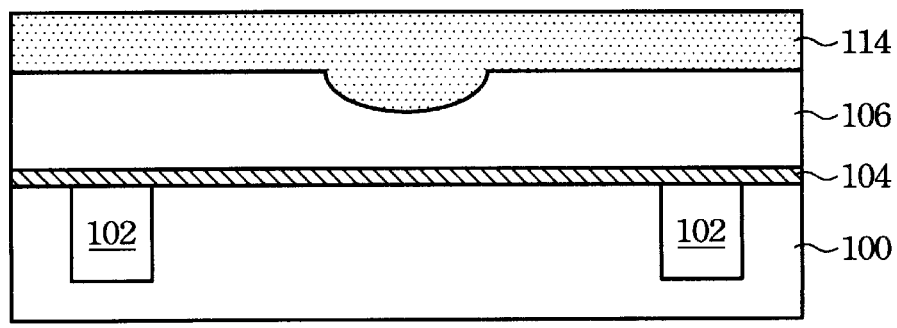

Referring now to FIG. 2C, a second dielectric layer 114 is formed to refill the dish-shaped hole 112. The second dielectric layer 114, generally composed of undoped silicon oxide, is deposited by a traditional low-pressure CVD (LPCVD) process or a plasma-enhanced CVD (PECVD) process to a thickness between 500 to 3000 Angstroms.

Figure 2D:
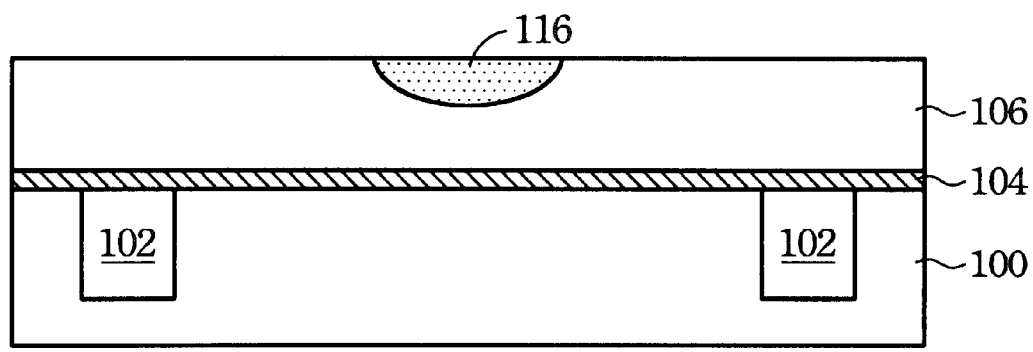

Referring now to FIG. 2D, a dielectric stud 116 is formed by performing a planarization process such as chemical mechanical polishing (CMP) to remove a portion of the second dielectric layer 114 outside the dish-shaped hole 112. As shown in FIG. 2D, the top surface of the dielectric stud 116 has the same level with that of the first silicon layer 106.

Figure 2E:
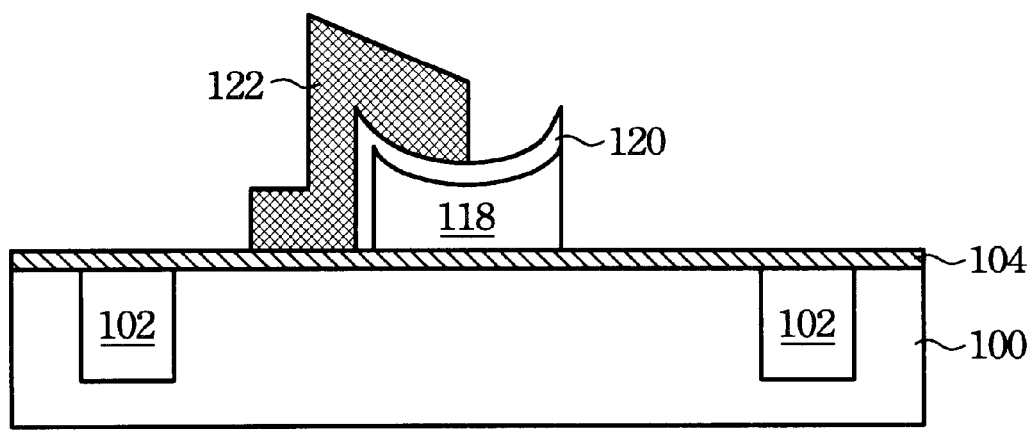

Referring now to FIG. 2E, a floating gate 118 is formed by performing an anisotropical etching process to etch an exposed portion of the first silicon layer 106. During the anisotropical etching process, the dielectric stud 116 serves as an etching mask. After that, the dielectric stud 116 is removed by performing a wet etching process using HF solution as etchant.

The floating gate 118 formed in this step has sharp corners which will have efficient electron injection between the floating gate and the control gate in the non-volatile memory cell. Thereafter, a tunneling dielectric layer 120 is formed by first depositing a dielectric layer and then patterning the dielectric layer by traditional photolithographic process and anisotropic etching process. The tunneling dielectric layer 120 is composed of silicon oxide, silicon, nitride, oxide/nitride composition film, or oxide/nitride/oxide composition film (ONO). Next, a control gate 122 is formed by first depositing a second silicon layer and then patterning the second silicon layer by traditional photolithographic process and anisotropical etching process.

The key feature of the present invention is that the floating gate having sharp corners is formed by simple conventional etching, deposition, and CMP processes. For this reason, the manufacture throughput according to the present invention is much higher than that of the prior art.

It should be understood that the foregoing relates to only preferred embodiments of the present invention, and that it is intended to cover all changes and modifications of the embodiments of the invention herein used for the purposes of the disclosure, which do not constitute departures from the spirit and scope of the invention.

What we claimed is:

1. A method of forming a non-volatile memory cell, said method comprising:
   a. forming a first dielectric layer and a first silicon layer on a semiconductor substrate;
   b. forming an etching stop layer on said first silicon layer;
   c. patterning said etching stop layer to form an opening;
   d. forming a dish-shaped hole by performing an isotropic etching process to partially etch said first silicon layer through said opening;
   e. removing said etching stop layer;
   f. forming a second dielectric layer to refill said dish-shaped hole;
   g. forming a dielectric stud by performing a planarization process to remove a portion of said second dielectric layer outside said dish-shaped hole;
   h. forming a floating gate with sharp corners by performing an anisotropical etching process to etch an exposed portion of said first silicon layer using said dielectric stud as an etching mask;
   i. removing said dielectric stud.

2. The method of claim 1, wherein said first silicon layer is composed of polysilicon.

3. The method of claim 1, wherein said first silicon layer is composed of amorphous silicon.

4. The method of claim 1, wherein said etching stop layer is a layer of photo resist.

5. The method of claim 1, wherein said etching stop layer is composed of dielectric material.

6. The method of claim 5, wherein said dielectric material is silicon oxide.

7. The method of claim 5, wherein said dielectric material is silicon nitride.

8. The method of claim 5, wherein said dielectric material is silicon oxynitride.

9. The method of claim 1, wherein said isotropic etching process is performed by wet etching.

10. The method of claim 9, wherein said wet etching process is performed by using a mixture solution of nitric acid and hydrofluoric acid.

11. The method of claim 1, wherein said isotropic etching process is performed by dry etching.

12. The method of claim 11, wherein said dry etching process is performed by using $Cl_2$ plasma.

13. The method of claim 1, wherein said second dielectric layer is composed of undoped silicon oxide.

14. The method of claim 1, wherein said planarization process is performed by chemical mechanical polishing (CMP).

15. The method of claim 1, after removing said dielectric stud further comprising:
 a. forming a tunneling dielectric layer over said floating gate; and
 b. forming a control gate of said non-volatile memory cell on said tunneling dielectric layer and said first dielectric layer.

16. The method of claim 15, wherein said tunneling dielectric layer is formed by first depositing a dielectric layer and then patterning said dielectric layer by photolithography process and etching process.

17. The method of claim 15, wherein said control gate is formed by first depositing a second silicon layer and then patterning said second silicon layer.

18. A method of forming a gate structure having sharp corners, said method comprising:
 a. forming a first dielectric layer and a polysilicon layer on a semiconductor substrate;
 b. forming an etching stop layer on said polysilicon layer;
 c. patterning said etching stop layer to form an opening;
 d. forming a dish-shaped hole by performing an isotropic etching process to partially etch said polysilicon layer through said opening;
 e. removing said etching stop layer;
 f. forming a second dielectric layer to refill said dish-shaped hole;
 g. forming a dielectric stud by performing a planarization process to remove a portion of said second dielectric layer outside said dish-shaped hole;
 h. forming said gate structure having sharp corners by performing an anisotropical etching process to etch an exposed portion of said polysilicon layer using said dielectric stud as an etching mask; and
 i. removing said dielectric stud.

19. The method of claim 18, wherein said isotropic etching process is performed by wet etching.

20. The method of claim 18, wherein said isotropic etching process is performed by dry etching.

* * * * *